US008822984B2

(12) United States Patent
Teague

(10) Patent No.: US 8,822,984 B2
(45) Date of Patent: Sep. 2, 2014

(54) METHOD AND SYSTEM FOR REDUCING DEVICE PERFORMANCE DEGRADATION OF ORGANIC DEVICES

(75) Inventor: Lucile C. Teague, Aiken, SC (US)

(73) Assignee: Savannah River Nuclear Solutions, LLC, Aiken, SC (US)

( * ) Notice: Subject to any disclaimer, the term of this patent is extended or adjusted under 35 U.S.C. 154(b) by 229 days.

(21) Appl. No.: 13/305,201

(22) Filed: Nov. 28, 2011

(65) Prior Publication Data

US 2013/0134327 A1 May 30, 2013

(51) Int. Cl.
*H01L 31/167* (2006.01)

(52) U.S. Cl.
USPC .................................. 257/40; 257/84; 257/82

(58) Field of Classification Search
CPC ....................... H01L 27/3274; H01L 29/78618
USPC ............................................................ 257/84
See application file for complete search history.

(56) References Cited

U.S. PATENT DOCUMENTS

2007/0257256 A1* 11/2007 Kugler ............................. 257/40

OTHER PUBLICATIONS

Dependence of persistent photocurrent on gate bias in inkjet printed organic thin-film transistor, Kim et al., Applied Physics Letters 96, 123301 (2010) pp. 123301-1-123301-3.
Photoresponsive characteristics and hysteresis of soluble 6, 13-bis (triisopropyl-silylethynyl)-pentacene-based organic thin film transistors with and without annealing, Cho et al., Journal of Applied Physics 107, 033711 (2010) pp. 033711-1-033711-6.
Reversible memory effects and acceptor states in pentacene-based organic thin-film transistors, Gu et al., Journal of Applied Physics 101, 014504 (2007) pp. 014504-1-014504-9.
Multibit Storage of Organic Thin-Film Field-Effect Transistors, Guo et al., Advanced Materials 2009, 21, pp. 1954-1959.
Organic Polymer Thin-Film Transistor Photosensors, Hamilton et al., IEEE Journal of Selected Topics in Quantum Electronics, vol. 10, No. 4, Jul./Aug. 2004, pp. 840-848.
Highly sensitive thin-film organic phototransistors: Effect of wavelength of light source on device performance, Noh et al., Journal of Applied Physics 98, 074505 (2005) pp. 074505-1-074505-7.
Effect of light irradiation on the characteristics of organic field-effect transistors, Noh et al., Journal of Applied Physics 100, 094501 (2006), pp. 094501-1-094501-6.
Optical, Fluorescent, and (photo)conductive Properties of High-Performance Functionalized Pentacene and Anthradithiophene Derivatives, Platt et al., J. Phys. Chem. C 2009, 113, pp. 14006-14014.

(Continued)

*Primary Examiner* — Matthew Landau
*Assistant Examiner* — Damon Hillman
(74) *Attorney, Agent, or Firm* — Dority & Manning, P.A.

(57) ABSTRACT

Methods and systems for reducing the deleterious effects of gate bias stress on the drain current of an organic device, such as an organic thin film transistor, are provided. In a particular aspect, the organic layer of an organic device is illuminated with light having characteristics selected to reduce the gate bias voltage effects on the drain current of the organic device. For instance, the wavelength and intensity of the light are selected to provide a desired recovery of drain current of the organic device. If the characteristics of the light are appropriately matched to the organic device, recovery of the deleterious effects caused by gate bias voltage stress effects on the drain current of the organic device can be achieved. In a particular aspect, the organic device is selectively illuminated with light to operate the organic device in multiple modes of operation.

17 Claims, 7 Drawing Sheets

(56) References Cited

OTHER PUBLICATIONS

Threshold Voltage Tuning of Low-Voltage Organic Thin-Film Transistors, Shang et al., IEEE Transactions on Electron Devices, vol. 58, No. 7, Jul. 2011, pp. 2127-2134.

New Organic Phototransistor with Bias-modulated Photosensitivity and Bias-Enhanced Memory Effect, Zan et al., IEEE Electron Device Letters, vol. 30, No. 7, Jul. 2009, pp. 721-723.

* cited by examiner

METHOD AND SYSTEM FOR REDUCING DEVICE PERFORMANCE DEGRADATION OF ORGANIC DEVICES

STATEMENT AS TO RIGHTS TO INVENTIONS MADE UNDER FEDERALLY SPONSORED RESEARCH AND DEVELOPMENT

This invention was made with Government support under Contract No. DE-AC09-085R22470 awarded by the United States Department of Energy. The Government has certain rights in the invention.

FIELD OF THE INVENTION

The subject matter of the present invention relates to organic-based devices, and more particularly to reducing device performance degradation over time of organic devices, such as organic thin film transistors.

BACKGROUND OF THE INVENTION

Transistors are common components of many integrated circuits used in electronic devices, such as computers, mobile phones, televisions, etc. Organic devices, such as organic thin film transistors (OTFTs) are becoming increasingly popular for use in future electronic devices due to lower production costs and due to other advantages. For instance, OTFTs can be manufactured using roll-to-roll processing, ink jet printing, spray-on techniques, and are able to be deposited on flexible substrates.

Certain organic devices, such as OTFTs, have at least three terminals including a source, a drain, and a gate. Application of a bias voltage to the gate controls the amount of charge carriers that flow between the source and the drain. When a sufficient gate bias voltage is applied, charge carriers accumulate such that a highly conductive channel is created between the source and drain. In certain organic devices, the highly conductive channel is formed in an organic semiconductor layer of the organic device. A voltage bias between the source and drain drives the current flowing in the conductive channel between the source and drain. The organic device typically includes a threshold voltage that constitutes the minimum gate voltage necessary to allow current to flow between the source and drain. If the voltage applied to the gate is less than the threshold voltage, only nominal current flows between the source and drain.

Organic devices, such as OTFTs, can suffer from device stability issues such that the devices lose reliability of performance over time. For instance, application of a gate voltage for extended periods of time can lead to reduced source drain current throughput. The deleterious bias stress effects from application of the gate voltage can happen within seconds and can cause continuous degradation for hours to even days.

FIG. 1 provides a graphical representation of the reduced performance of an exemplary OTFT device over time due to application of a gate voltage. In particular, FIG. 1 illustrates the steady state response of an exemplary OTFT device with a gate voltage $V_g$ of about −40V and a source drain bias $V_{SD}$ of about −20V. As illustrated by curve 100, the magnitude of the source drain current $I_{SD}$ substantially decreases with the passage of time due to bias stress effects resulting from the application of the gate voltage. The threshold voltage of the OTFT can also shift overtime, leading to reduced performance and reliability of the device.

An organic device can recover its original performance characteristics by removing the gate bias voltage for a period of time. The recovery time for the organic device, however, can often impose undesirable operating limits on the organic device. For instance, the recovery time can take several minutes to several hours depending on the amount of time the gate bias voltage was applied to the organic device. Moreover, the need to periodically remove a gate bias voltage from the organic device for a sufficient period of time to allow the organic device to recover its original performance characteristics can pose a barrier to wide range application of the organic devices.

The photoresponse of organic devices, such as OTFTs is known. For instance, the effects on drain current and threshold voltage of an exemplary OTFT as a result of illuminating the OTFT with monochromatic light at varying wavelengths and intensities are set forth in Michael C. Hamilton and Jerry Kanicki, "Organic Polymer Thin-Film Transistor Photosensors," IEEE Journal of Selected Topics in Quantum Electronics, Vol. 10, No. 4, July/August 2004. Such techniques, however, fail to address reduction of gate bias voltage effects on the drain current while the gate bias voltage is applied to an organic device over time.

Thus, a need exists for a solution to reduce deleterious effects of organic devices as a result of gate bias stress. A solution that can provide for predictable control of the drain current response such that the organic device can be placed into multiple modes of operation on command would be particularly useful.

BRIEF DESCRIPTION OF THE INVENTION

Aspects and advantages of the invention will be set forth in part in the following description, or may be obvious from the description, or may be learned through practice of the invention.

One exemplary aspect of the present disclosure is directed to a method for adjusting the drain current of an organic device. The organic device includes a gate, a source, a drain, and a layer of organic semiconductor material. The method includes applying a source drain bias voltage between the source and the drain of the organic device and applying a gate bias voltage to the gate of the organic device. The gate voltage exceeds a threshold voltage for the organic device such that a drain current flows between the source and drain. The method includes illuminating the layer of organic semiconductor material with light from a light source while the gate bias voltage is applied to the organic device. Characteristics of the light are selected to reduce gate bias voltage stress effects on the drain current of the organic device.

Another exemplary aspect of the present disclosure is directed to a system for adjusting the drain current of an organic device. The organic device includes a gate, a source, a drain, and a layer of organic semiconductive material. The system includes a voltage source configured to apply a gate bias voltage to the gate of the organic device. The gate bias voltage exceeds a threshold voltage for the organic device such that a drain current flows between the source and drain. The system further includes a light source configured to illuminate the layer of organic semiconductor material with light. The light has characteristics sufficient to reduce gate bias voltage stress effects on the drain current of the organic device.

Yet another exemplary aspect of the present disclosure is directed to an apparatus including an organic thin film transistor layer, an organic light emitting diode layer, and a transparent layer located between the organic thin film transistor layer and the organic light emitting diode layer. The organic thin film transistor layer includes at least one organic thin film transistor having a gate, a source, a drain, and an organic semiconductor film. The organic light emitting diode layer includes at least one organic light emitting diode configured to illuminate the organic semiconductor film of the at least one organic thin film transistor with light. The light emitted from the light emitting diode has a peak emission wavelength and/or intensity sufficient to reduce gate bias voltage stress effects on a drain current of the at least one organic thin film transistor.

Variations and modifications can be made to these exemplary aspects of the present disclosure. These and other features, aspects and advantages of the present invention will become better understood with reference to the following description and appended claims.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to reducing the deleterious effects of gate bias stress on the drain current of an organic device, such as an organic thin film transistor (OTFT). In a particular aspect, the organic layer of an organic device is illuminated with light having characteristics selected to reduce the gate bias voltage effects on the drain current of the organic device. For instance, the wavelength and/or intensity of the light are selected to provide a desired recovery of the drain current of the organic device. If the characteristics of the light are appropriately matched to the organic device, recovery of the deleterious effects caused by gate bias voltage stress effects on the drain current of the organic device can be achieved.

In one aspect, the peak emission wavelength of the light illuminating the organic layer is selected based at least in part on the absorption characteristics of the organic layer. For instance, the peak emission wavelength of the light is selected to correspond to one or more peak absorption wavelengths for the organic material used in the organic device. The intensity of the light can also be adjusted based on physical parameters of the organic device to provide a desired effect on the drain current of the organic device.

In a particular implementation, the characteristics of the light are selected to provide a predictable drain current response to the illumination of the organic layer with light. The predictable drain current response allows the organic device to be operated in multiple modes, depending on the characteristics of the light illuminated onto the organic layer. In this manner, the subject matter of the present disclosure allows for control of drain current response such that the organic device can be placed into multiple modes of operation on command.

Figure 2:
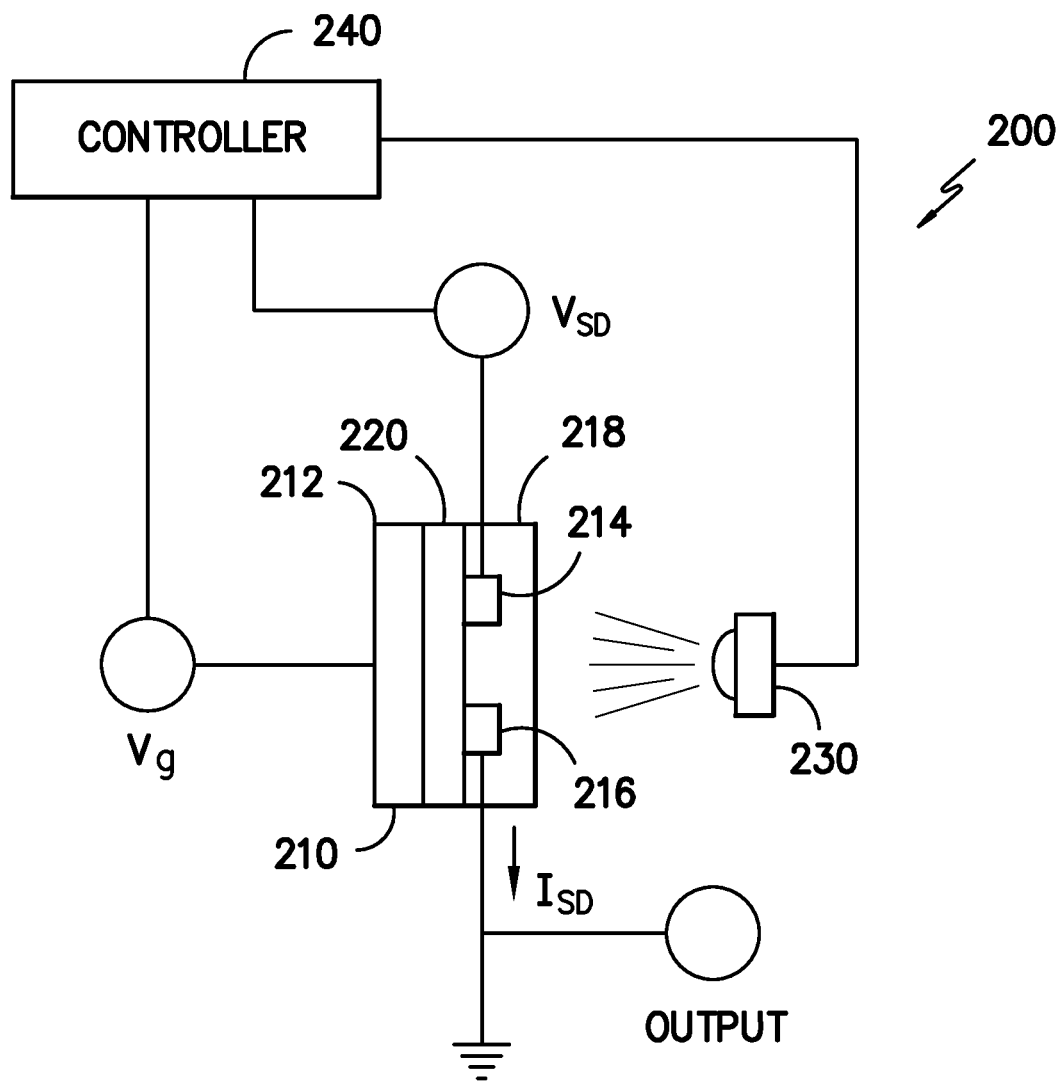
FIG. 2 depicts a block diagram of an exemplary system according to an exemplary embodiment of the present disclosure.

FIG. 2 depicts a block diagram of a system 200 according to an exemplary aspect of the present disclosure. As shown, system 200 includes an organic device 210, such as an OTFT. The organic device includes a gate 212, a source 214, and a drain 216. An organic layer 218 of organic semiconductor material is disposed between source 214 and drain 216. The organic semiconductor material can be any suitable organic semiconductor material such as 5,11 bis(triethlysilyethynyl) anthradithiophene or other suitable organic semiconductor material. A dielectric layer 220 is disposed between the gate 212 and the organic layer 218. The dielectric layer 220 can be composed of a material such as silicon dioxide or other suitable dielectric material.

Figure 1:
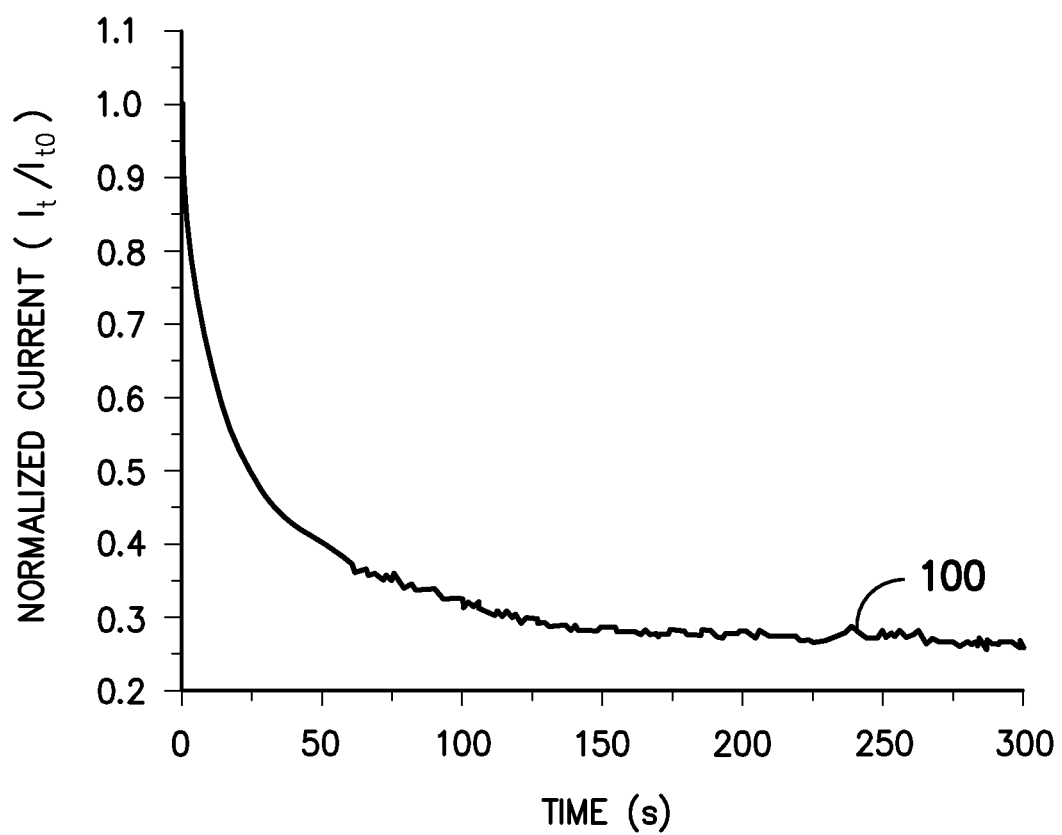
FIG. 1 provides a graphical representation of the deleterious effects of gate bias voltage on the drain current of an exemplary organic device over time.

Upon application of a source drain bias voltage $V_{DS}$ and a gate bias voltage $V_g$ that exceeds a threshold voltage for the organic device 210, a drain current $I_{SD}$ will flow in a conductive channel formed in the organic semiconductor layer 218 between source 214 and drain 216. The source drain bias voltage $V_{SD}$ drives the drain current $I_{SD}$. As shown in FIG. 1, however, the magnitude of the drain current $I_{SD}$ will decrease over time due to gate bias stress effects resulting from application of the gate bias voltage $V_g$ to the gate electrode 212. For instance, as shown by curve 100 in FIG. 1, the drain current $I_{SD}$ has a first magnitude when the gate bias voltage $V_g$ is first applied to the gate of the organic device. The drain current $I_{SD}$ is reduced to a second magnitude over time due to gate bias voltage stress effects. As discussed in detail below, these gate bias voltage stress effects can be reduced by illuminating the organic layer 218 of the organic device 210 with light from light source 230.

Light source 230 can be any source configured to illuminate the organic layer 218 with light. For instance, the light source 230 can include one or more light emitting diodes (LEDs), such as organic light emitting diodes (OLEDs). The light source 230 can emit monochromatic light having a single peak emission wavelength or can include a blend of light having a range of wavelengths. According to aspects of the present disclosure, the characteristics of the light emitted from the light source 230 are selected to reduce the gate bias voltage stress effects on the drain current $I_{SD}$ of the organic device 210. For example, the wavelength and/or intensity of the light emitted from light source 230 can be selected to reduce the gate bias voltage stress effects on the drain current $I_{SD}$ of the organic device 210.

Figure 3:
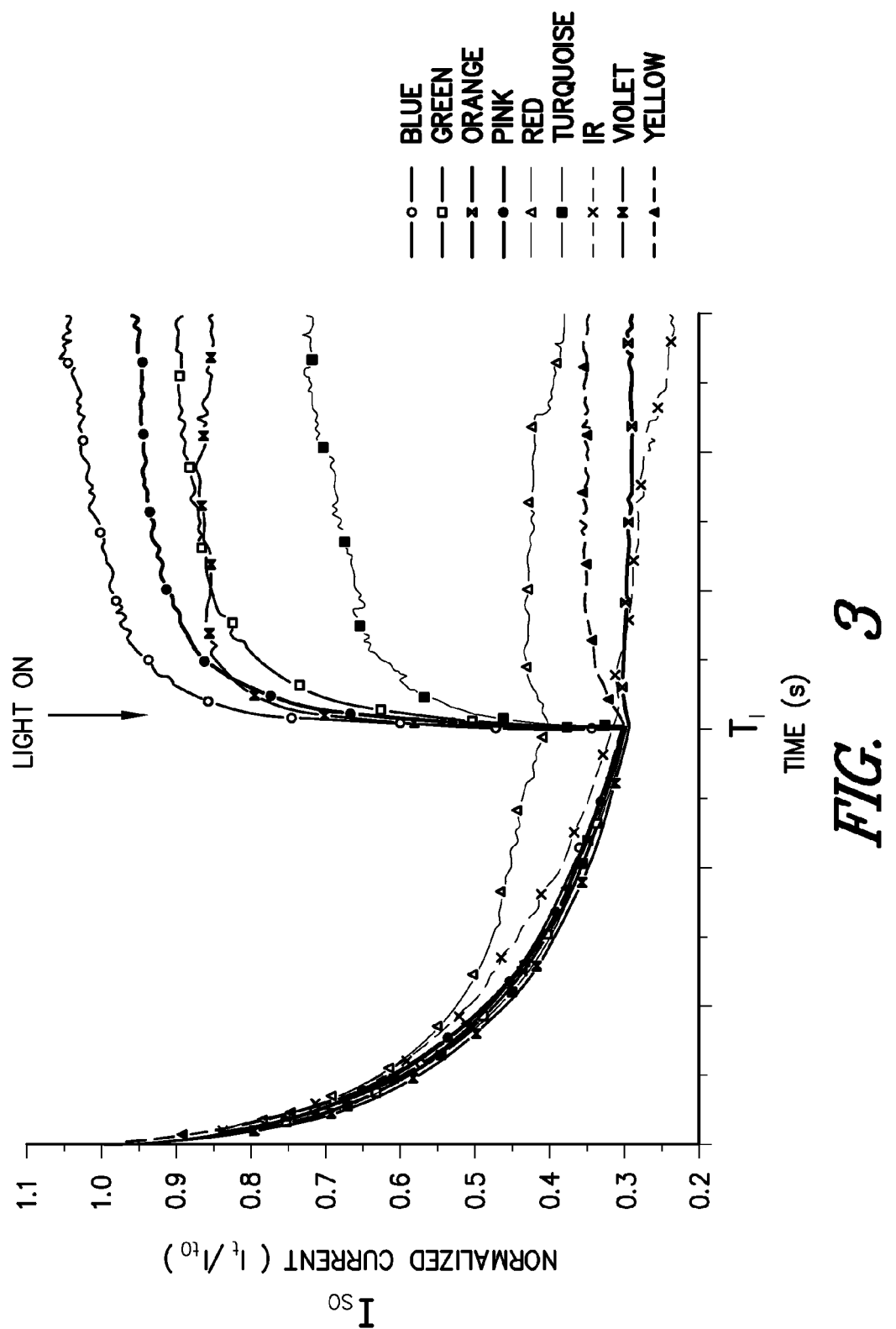
FIG. 3 depicts the steady-state response of the drain current to gate bias voltage and illumination with light of an exemplary organic device according to an exemplary embodiment of the present disclosure.
Figure 4:
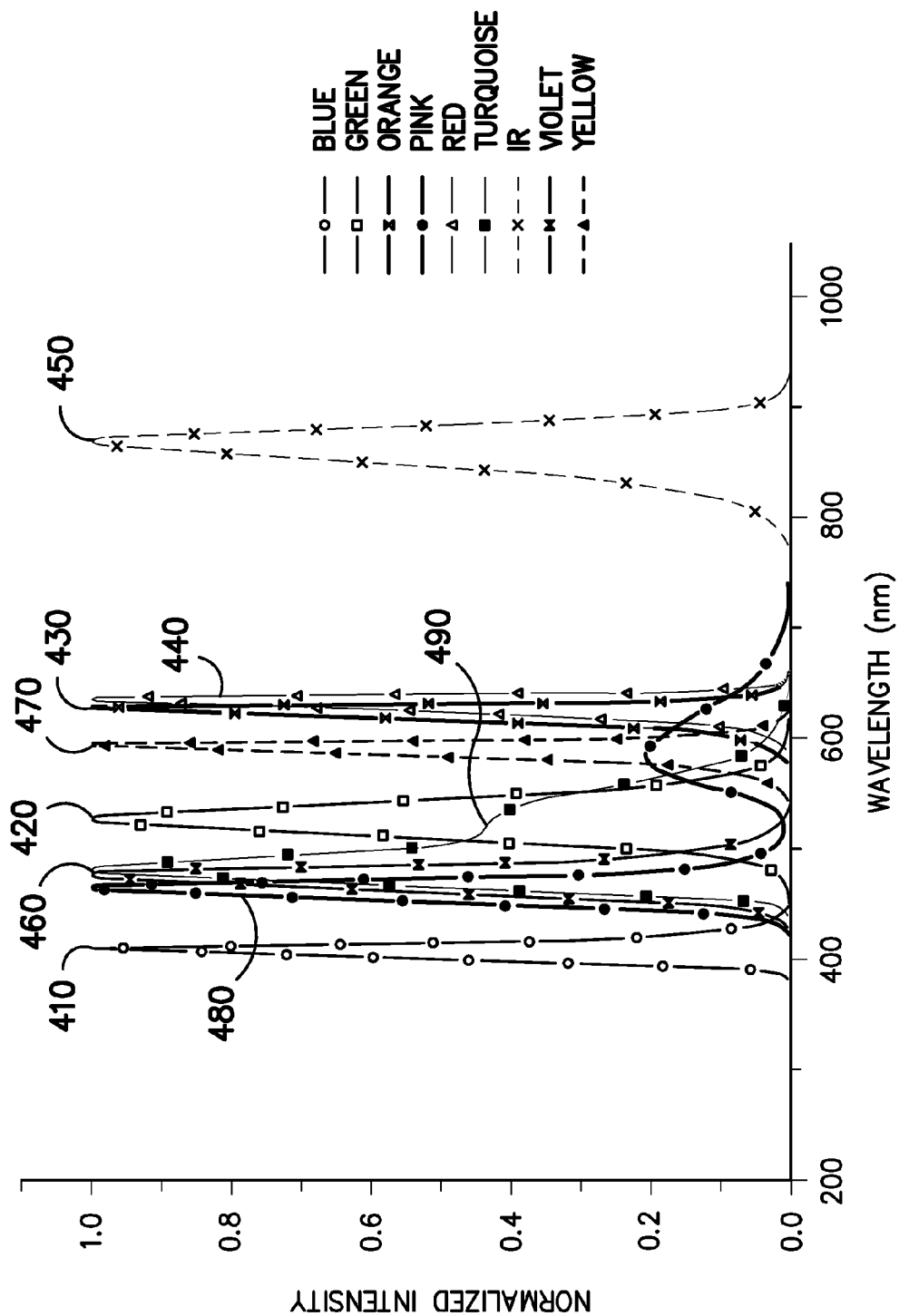
FIG. 4 depicts exemplary wavelength ranges for exemplary light sources according to an exemplary embodiment of the present disclosure.

The responsiveness of the drain current of an exemplary organic device to illumination with light at varying wavelengths is depicted in FIG. 3. The results depicted in FIG. 3 were obtained for an exemplary OTFT having a gate bias voltage $V_g$ of about −40V and a source-drain voltage $V_{SD}$ of −20V. As shown, the magnitude of the drain current for the organic device is reduced from a first magnitude to a second magnitude over time as a result of application of a gate bias voltage to the gate of the organic device. At time $T_1$, the organic semiconductor layer of the organic device is illuminated with light having a particular peak emission wavelength or range of wavelengths. The wavelength spectra of the varying light sources are depicted in FIG. 4. At least a portion of the drain current of the organic device is recovered after illumination of the organic semiconductor material of the organic device with light.

As shown in FIG. 3, the responsiveness of the drain current of the organic device is dependent on the wavelength of the light. For instance, as shown by curve 310 of FIG. 3, the illumination of the organic device with blue light (peak emission wavelength of about 470 nm) results in a substantial recovery of the drain current of the organic device. In particular, illumination of the organic semiconductor device with blue light results in a return of the drain current to within about 80% of the magnitude of the original drain current for the organic device. Indeed, illumination of the organic semiconductor device with blue light results in a return of the drain current to within about 100% (full recovery) of the original drain current for the organic device.

The responsiveness of the organic device to light at other wavelengths results in at least a partial recovery of the drain current of the organic device. For instance, as shown by curve 320 of FIG. 3, illumination of the organic semiconductive material of the organic device with green light (peak emission wavelength of about 523 nm) results in a partial recovery of the original drain current of the organic device. In particular, illumination of the organic device with the green light results in a drain current having magnitude that is less than the first magnitude of the drain current achieved when the gate bias voltage is first applied to the organic device and that is greater than a second magnitude of the drain current resulting from gate bias voltage stress effects of the organic device. In this manner, the subject matter of the present disclosure provides for reduction of the deleterious effects on drain current caused by gate bias voltage stress through the illumination of light on the active organic material of the organic device.

Figure 5:
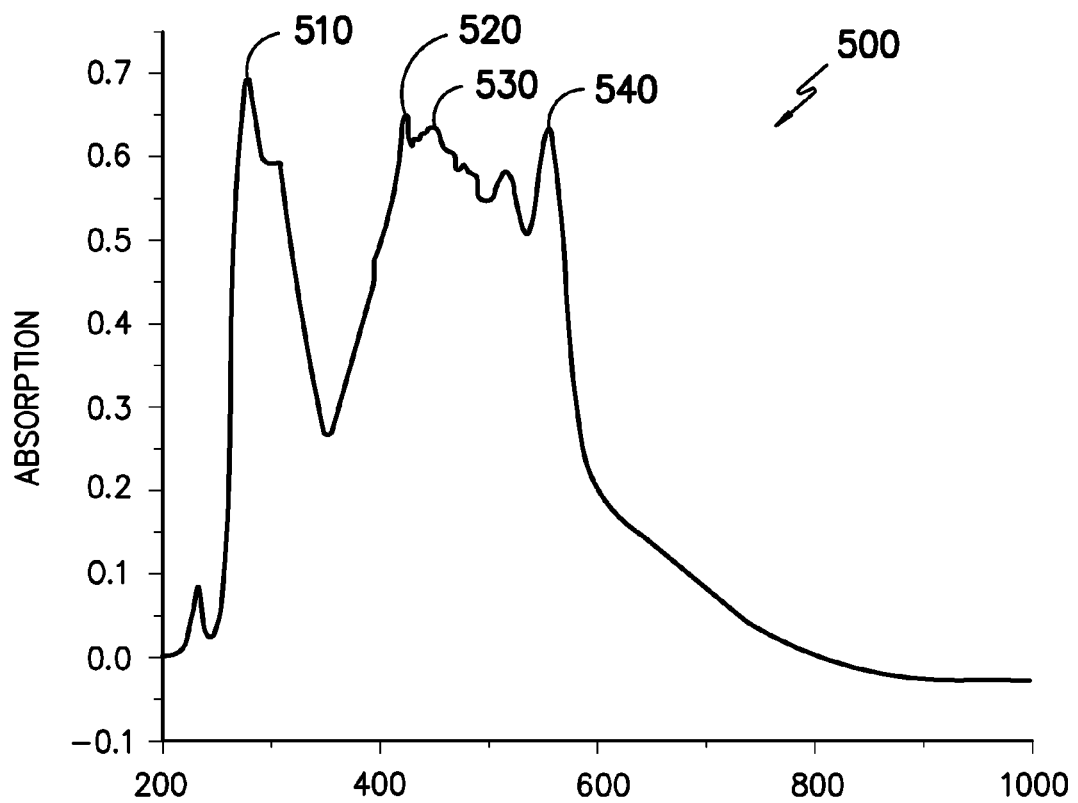
FIG. 5 depicts an exemplary absorption spectra for an exemplary organic semiconductor film according to an exemplary embodiment of the present disclosure.

According to particular aspects of the present disclosure, the light illuminated on to the organic layer 218 of organic device 210 by light source 230, has a peak emission wavelength selected based on the absorption properties of the organic layer 218. FIG. 5 depicts an exemplary absorption spectra 500 across a range of wavelengths for an exemplary organic semiconductor material used in organic device 210. The absorption spectra depicted in FIG. 5 is the absorption spectra of the organic semiconductor material in a film state (as opposed to in solution before application onto of the organic device). As shown in FIG. 5, the organic semiconductor material has a plurality of peak absorption wavelengths 510, 520, 530 and 540. It has been discovered that the drain current of an organic device exhibits greater recovery from gate voltage bias stress effects when the wavelength of the light illuminating the organic semiconductor material is selected to correspond with one or more of the peak absorption wavelengths for the organic material in the film state.

FIG. 4 depicts exemplary wavelength ranges of exemplary light that can be used to illuminate an organic device according to exemplary aspects of the present disclosure. Curves 410 (blue light), 420 (green light), 430 (orange light), 440 (red light), 450 (infrared light), 460 (violet light), and 470 (yellow light) are obtained from a light source emitting a light having a peak emission wavelength set forth in Chart I below:

CHART I

| Color | Curve | Light Source Peak Wavelength |
| --- | --- | --- |
| Blue | 410 | About 470 nm |
| Green | 420 | About 523 nm |
| Orange | 430 | About 624 nm |
| Red | 440 | About 631 nm |
| Infrared | 450 | About 866 nm |
| Violet | 460 | About 404 nm |
| Yellow | 470 | About 590 nm |

Curve 480 (pink light) and curve 490 (turquoise light) comprise a blend of light across a range of wavelengths.

As shown in FIG. 4, the peak emission wavelength for blue light corresponds to a peak absorption wavelength (peak 520) of FIG. 5 for the organic semiconductor material. As a result, illumination of an organic device with light having a peak emission wavelength in the range of blue light results in a substantial recovery of the drain current as shown by curve 310 of FIG. 3. As further shown in FIG. 3, illumination of the organic semiconductor material with orange light, yellow light, pink light, green light, and turquoise light also results in a reduction of gate bias voltage stress effects on the drain current of the organic device.

Those of ordinary skill in the art, using the disclosures provided herein, should understand that different organic semiconductor materials and their subsequent films will have different peak absorption wavelengths. In these cases, light at different wavelengths can produce varying responses on the gate bias voltage stress effects on the drain current of the organic device. According to aspects of the present disclosure, the wavelength of the light is selected to produce the desired drain current response based on the absorption spectra of the active organic semiconductor film used in the organic device.

The intensity of the light illuminated on the active organic semiconductor layer of the organic device can also be adjusted to achieve the desired drain current response of the organic device. The intensity of the light can be adjusted, for instance, to compensate for structural properties of the organic semiconductor layer. For instance, higher intensity light may be necessary to achieve desired results for thicker organic semiconductor films. In addition, the intensity of the light necessary to achieve desired results can be dependent on grain structure and molecular packing of the organic semiconductor film. Accordingly, aspects of the present disclosure include varying the intensity and/or the peak emission wavelength of the light illuminating the active organic semiconductor layer of the organic result to achieve a desired drain current response.

Figure 6:
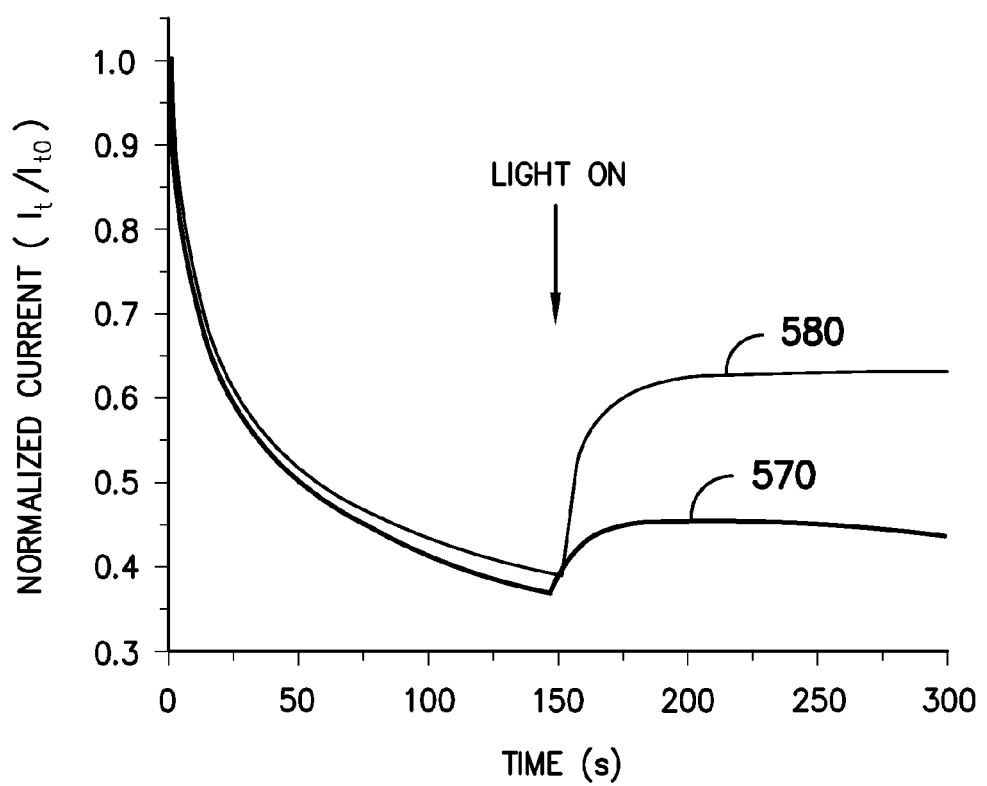
FIG. 6 depicts the steady-state response of the drain current to gate bias voltage and illumination with light with varying intensities of an exemplary organic device according to an exemplary embodiment of the present disclosure.

FIG. 6 depicts the exemplary response of the drain current of an organic device to blue light (peak emission wavelength of about 470 nm) at varying intensities. Curve 570 depicts the normalized drain current response for illumination of an organic device with blue light at about 0.012 W/m². Curve 580 depicts the normalized drain current response for illumination of the organic device with blue light at about 0.064

W/m². As shown, the drain current response can be adjusted by varying the intensity of the light illuminated onto the organic device. In a particular implementation, the intensity of the light is selected to provide recovery to within about 80% of the original drain current, such as within about 100% (full recovery) of the original drain current.

Referring back to FIG. 2, system 200 further includes a controller 240 used to control various aspects of system 200. For instance, controller 240 can send signals to light source 230 to selectively illuminate the organic semiconductor layer 218 of the organic device 210 to reduce bias stress effects on the drain current $I_{SD}$ of the organic device 210. Controller 240 can also be used to adjust the gate bias voltage $V_g$ and/or the drain-source voltage $V_{DS}$ to control the output of organic device 210.

The system 200 can be used to operate the organic device 210 in multiple modes of operation, with each mode of operation providing a different predictable output of the organic device. As is known in the art, the organic device 210 can be operated in two states simply be applying a gate bias voltage to the gate 212 of the organic device 210. In particular, the organic device 210 can be turned "On" such that a drain current flows between source 214 and drain 216 by application a source drain bias voltage between the source 214 and drain 216 and by application of a gate bias voltage $V_g$ that is greater than a threshold voltage for the organic device 210. The organic device 210 can be turned "Off" such that only nominal drain current flows between source 214 and drain 216 when a gate bias voltage $V_g$ of less than the threshold voltage for the organic device 210 is applied to the gate 212.

According to aspects of the present disclosure, the organic device 210 could be operated in yet a third state by illuminating the organic device 210 with light at a first wavelength or range of wavelengths. The light can have characteristics selected such that the organic device 210 produces a drain current having a magnitude different from the magnitude of the drain current in either the "Off" state or the "On" state. For instance, with reference to the exemplary organic device response shown in FIG. 3, the light can be selected to have a wavelength in the green light range (peak emission wavelength in the range of about 495 nm to about 570 nm). Illuminating the organic device with light at this particular wavelength will cause the organic device to have a drain current magnitude that is different from the drain current magnitude in the "Off" state and the "On" state. In this regard, the organic device 210 can be selectively controlled to provide varying drain current outputs in three different modes of operation by controlling the gate bias voltage $V_g$ and/or the light illuminated onto the active organic semiconductor layer 218 of the organic device 210.

According to yet further aspects of the present disclosure, the organic device 210 can be operated in a fourth state by illuminating the organic device 210 with light at a second wavelength or range of wavelengths. In this implementation, the second wavelength or range of wavelengths can be selected to produce a drain current having a magnitude different from the magnitude of the drain current in the "Off" state, the "On" state, and different from the magnitude of the drain current when the organic device is illuminated with light at the first wavelength.

For instance, with reference to the exemplary organic device response shown in FIG. 4, the second wavelength can be selected such that the light is in the blue light range (peak emission wavelength in the range of about 450 nm to about 475 nm). As shown, this will produce a drain current that is different from the "Off" state, the "On" state, and different from the drain current when the organic device is illuminated with green light. As a result, the organic device can be operated to have four different modes of operation. The modes of operation can be selected by controlling the gate bias voltage and/or the light illuminated onto the organic device.

While the present disclosure is made with reference to an organic device that can be operated in three or four modes of operation, those of ordinary skill in the art, using the disclosures provided herein, should understand that an organic device can be operated with more modes of operation by controlling the characteristics of the light emitted onto the organic semiconductor layer of the organic device. For instance, lights of many varying wavelengths can be selectively emitted onto the organic device to achieve varying drain current outputs for the organic device.

Figure 7:
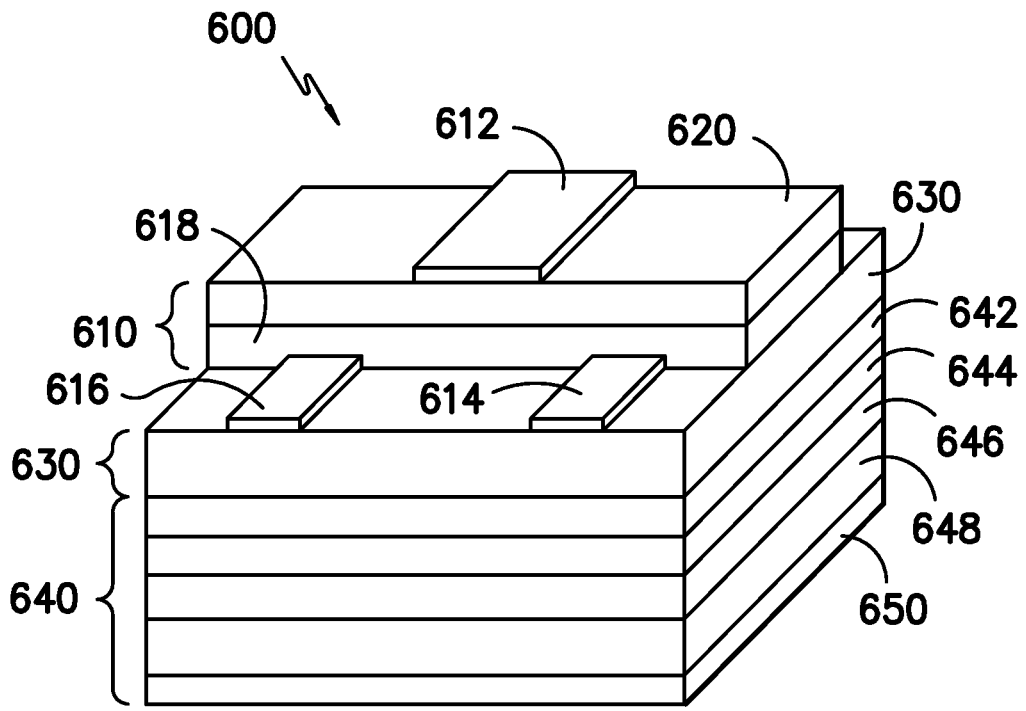
FIGS. 7 and 8 depict exemplary structures comprising OTFT devices and OLED devices according to an exemplary embodiment of the present disclosure.

FIG. 7 depicts an exemplary structure 600 for reducing the gate bias voltage effects of an organic thin film transistor according to an exemplary embodiment of the present disclosure. The structure 600 includes an organic thin film transistor (OTFT) portion 610, a transparent layer portion 630, and an organic light emitting diode (OLED) portion 640.

OTFT portion 610 includes a gate 612, a source 614, and a drain 616. An active organic semiconductor layer 618 is disposed between source 614 and drain 616. Dielectric layer 620 is disposed between the gate 612 and active organic semiconductor layer 618. As discussed above, a gate bias voltage can be applied to gate 612 to control the flow of current between source and drain. Application of a gate bias voltage for extended periods of time to gate 612 results in reduction of the drain current between source 614 and drain 616. The OTFT portion 610 depicted in FIG. 7 is a top-gated OTFT. Those of ordinary skill in the art, using the disclosures provided herein, should understand that the present subject matter is equally applicable to other organic devices, such as bottom-gated OTFTs.

OLED portion 640 is configured to illuminate the active organic semiconductor layer 618 of the organic thin film transistor portion 610 to reduce the gate bias voltage stress effects on the drain current. OLED portion includes numerous layers as is known in the art, including a transparent anode layer 642, a hole transporting layer 644, an emitting layer 646, an electron transporting layer 648, and a cathode layer 650. Emitting layer 646 is an emissive electroluminescent layer that includes a film of organic compounds which emit light in response to an electrical stimulus or bias across the anode 642 and cathode 650 terminals. In particular, a bias across the anode 642 and cathode 650 terminals causes hole transporting layer 644 to transport holes to the emitting layer 646 and the electron transport layer 648 to transport electrons to emitting layer 646. The electrons and holes recombine in the emitting layer 650 causing the emitting layer 646 to emit light.

Upon application of a bias across the anode 642 and cathode 650 terminals of OLED portion 650, the emitting layer 646 emits light through transparent layers 632 and 642 onto the active organic semiconductor layer 618 of the OTFT portion 610 of the structure 600. The OLED portion 640 is configured to emit light having characteristics that will reduce the gate bias voltage effects on the drain current of the OTFT portion 610. For instance, as discussed above, the wavelength and intensity of the light can be selected to reduce the gate bias voltage effects of the OTFT portion 610. In a particular implementation, the light emitted from the OLED portion 640 can have a peak emission wavelength that corresponds to a peak absorption wavelength of the active organic semiconductor layer 618.

The structure 600 can also have multiple modes of operation based on control of the gate bias voltage applied to gate 612 and control of signals applied to the anode 642 and the cathode 650. In particular and as discussed above, the drain current can be controlled to be in an "On" state and an "Off" state through control of the gate bias voltage applied to the gate 612 in conjunction with a source and drain bias applied across the source 614 and drain 616. The third state can be controlled by illuminating the active organic semiconductor layer 618 with light from the OLED portion 640. Illumination of the active organic semiconductor layer 618 with light from the OLED portion 640 will reduce the gate bias voltage stress effects on the OTFT portion 610, leading to a different drain current when compared to operation in the "On" state or "Off" state. The wavelength of the light emitted from the OLED portion 640 is preferably selected to provide a highly predictable response of the drain current so that the output of OTFT portion 610 can be tightly controlled through control of the gate, source, and drain bias voltages and/or the OLED portion 640.

Figure 8:
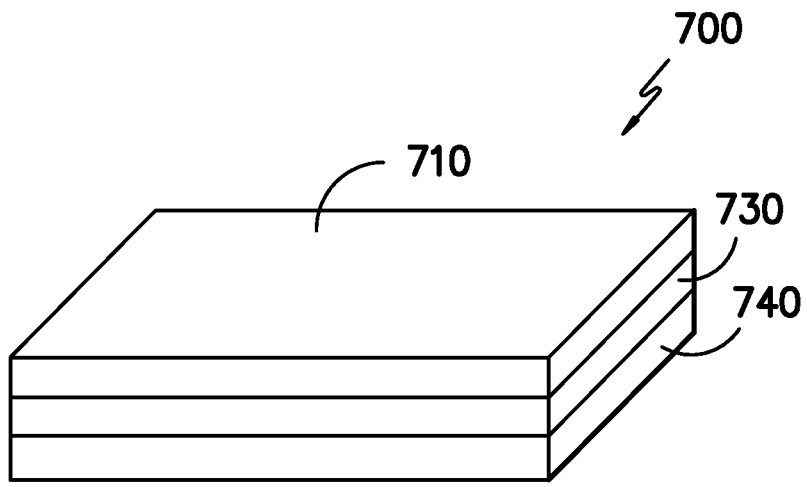

FIG. 8 depicts a composite structure 700 that includes a plurality of top-gated OTFT structures and a plurality of OLED structures in accordance with aspects of the present disclosure. In particular, the structure 700 includes an OTFT layer 710 that includes a plurality of OTFT devices. The OTFT devices can be constructed similar to the OTFTs discussed herein or any other suitable manner. The structure 700 also includes an OLED layer 740 that includes a plurality of OLED devices. A transparent layer 730 is disposed between the OTFT layer and the OLED layer.

In accordance with aspects of the present disclosure, each of the OLED devices in the OLED layer 740 is associated with an OTFT device in the OTFT layer 710. In particular, each of the OLED devices in the OLED layer 740 is configured to illuminate an OTFT device in the OTFT layer 710 with light having characteristics sufficient to reduce gate bias voltage stress effects on the OTFT devices in the OTFT layer 710. In this manner, the composite structure 700 can provide for the reduction of gate bias stress effects on the drain current of a plurality of OTFT devices in the OTFT layer 710 through use of one or more OLEDs in the OLED layer 740.

The composite structure 700 can also be used to provide selective control of multiple OTFT devices in OTFT layer 710 in multiple modes of operation. As discussed above, each of the OTFT devices in OTFT layer 710 can be controlled to operate in three or more modes of operation depending on the gate voltage bias applied to the OTFT device and the characteristics of the light emitted onto the active organic semiconductor layer of the OTFT device. Control of the multiple OLED devices in the OLED layer 740 can thus be used as part of the control of the OTFT devices in the OTFT layers 710.

For instance, in a particular implementation, each of the OLEDs in the OLED layer 740 can include a unique address and at least one associated OTFT device in the OTFT layer 710. A controller can send signals to selected OLEDs in the OLED 740 using the unique address information to selectively control OTFT devices associated with the selected OLEDs. In this manner, the composite structure 700 can provide for addressable control of a plurality of OLED devices to reduce the gate bias voltage stress effects for selected OTFT devices.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for adjusting the drain current of an organic device, the organic device comprising a gate, a source, a drain and a layer of organic semiconductor material, the method comprising:
   applying a source drain bias voltage between the source and the drain of the organic device;
   applying a gate bias voltage to the gate of the organic device, the gate bias voltage exceeding a threshold voltage for the organic device such that a drain current flows between the source and drain;
   illuminating the layer of organic semiconductor material with light from a light source while the gate bias voltage is applied to the organic device;
   wherein a peak emission wavelength of the light is selected to reduce gate bias voltage stress effects on the drain current of the organic device based at least in part on a peak absorption wavelength for the organic semiconductor material.

2. The method of claim 1, wherein the organic device is an organic thin film transistor.

3. The method of claim 1, wherein the light comprises a blend of light from a plurality of light sources, the characteristics of the blend of light being selected based on absorption properties of the organic semiconductor material.

4. The method of claim 1, wherein the characteristics of the visible light comprise an intensity of the light.

5. The method of claim 1, wherein the characteristics of the light comprise an intensity and a wavelength of the visible light.

6. The method of claim 1, wherein the drain current has a first magnitude when the gate bias voltage is first applied to the gate and a second magnitude after the application of the gate bias voltage for a period of time.

7. The method of claim 6, wherein the characteristics of the light are selected such that the magnitude of the drain current returns to within about 80% of the first magnitude when the organic semiconductor layer is illuminated with the light.

8. The method of claim 6, wherein the characteristics of the light are selected such that the drain current has a third magnitude when the organic layer is illuminated with the light, the third magnitude being less than the first magnitude and greater than the second magnitude.

9. The method of claim 8, wherein the method comprises selectively illuminating the organic semiconductor layer with the light to selectively vary the magnitude of the drain current between the second magnitude and the third magnitude.

10. A system for adjusting the drain current of an organic device, the organic device comprising a gate, a source, a drain and a layer of organic semiconductor material, the system comprising:
   a voltage source configured to provide a gate bias voltage to the gate of the organic device, the gate bias voltage exceeding a threshold voltage for the organic device such that a drain current flows between the source and drain;
   a light source configured to illuminate the layer of organic semiconductor material with light;
   wherein a peak emission wavelength of the light is selected to reduce gate bias voltage stress effects on the drain current of the organic device based at least in part on a peak absorption wavelength for the organic semiconductor material.

11. The system of claim 10, wherein the organic device is an organic thin film transistor.

12. The system of claim 10, wherein the light has a peak emission wavelength that corresponds to a peak absorption wavelength for the organic semiconductor material.

13. The system of claim 10, wherein the light source comprises an organic light emitting diode.

14. The system of claim 10, wherein the system further comprises a controller, the controller configured to control the light source to selectively illuminate the layer of organic semiconductor material to control the drain current of the organic device.

15. An apparatus, comprising:
- an organic thin film transistor layer, the organic thin film transistor layer comprising at least one organic thin film transistor having a gate, a source, a drain and an organic semiconductor film;
- an organic light emitting diode layer comprising at least one organic light emitting diode configured to illuminate the organic semiconductor film of the at least one organic thin film transistor with light;
- a transparent layer disposed between the organic thin film transistor layer and the organic light emitting diode layer;
- wherein a peak emission wavelength of the light is selected to reduce gate bias voltage stress effects on the drain current of the organic device based at least in part on a peak absorption wavelength for the organic semiconductor material.

16. The apparatus of claim 15, wherein the peak emission wavelength of the light emitted from the at least one organic light emitting diode corresponds to one or more peak absorption wavelengths of the organic semiconductor film of the at least one organic thin film transistor.

17. The apparatus of claim 15, wherein the organic thin film transistor layer comprises a plurality of organic thin film transistors, the organic light emitting diode layer has a plurality of organic light emitting diodes, each of the plurality of organic light emitting diodes being associated with one of the plurality of organic thin film transistors, wherein each of the light emitting diodes is configured to illuminate the organic semiconductor film of its associated organic thin film transistor.

* * * * *